(12) United States Patent
Jeon

(10) Patent No.: US 9,761,309 B2
(45) Date of Patent: Sep. 12, 2017

(54) SENSING CIRCUIT FOR RESISTIVE MEMORY ARRAY

(71) Applicant: Hewlett Packard Enterprise Development LP, Houston, TX (US)

(72) Inventor: Yoocharn Jeon, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/114,760

(22) PCT Filed: Feb. 28, 2014

(86) PCT No.: PCT/US2014/019352
§ 371 (c)(1),
(2) Date: Jul. 27, 2016

(87) PCT Pub. No.: WO2015/130304
PCT Pub. Date: Sep. 3, 2015

(65) Prior Publication Data
US 2016/0343433 A1 Nov. 24, 2016

(51) Int. Cl.
*G11C 13/00* (2006.01)

(52) U.S. Cl.
CPC .... *G11C 13/004* (2013.01); *G11C 2013/0054* (2013.01); *G11C 2213/70* (2013.01); *G11C 2213/77* (2013.01)

(58) Field of Classification Search
CPC .................................................. G11C 13/004
See application file for complete search history.

(56) References Cited

U.S. PATENT DOCUMENTS

| 5,748,519 | A | 5/1998 | Tehrani et al. |
| 6,765,835 | B1 | 7/2004 | Theel |
| 6,829,188 | B2 | 12/2004 | Baker |
| 7,495,984 | B2* | 2/2009 | Kim .................. G11C 7/062 365/148 |
| 7,719,913 | B2 | 5/2010 | Lung et al. |
| 7,796,454 | B2 | 9/2010 | Lin et al. |
| 7,876,607 | B2 | 1/2011 | Tang |

(Continued)

OTHER PUBLICATIONS

International Searching Authority, The International Search Report and the Written Opinion, Nov. 25, 2014, 10 Pgs.

(Continued)

*Primary Examiner* — Hoai V Ho
*Assistant Examiner* — Tri Hoang
(74) *Attorney, Agent, or Firm* — Fabian VanCott

(57) ABSTRACT

A method and a circuit for reading resistive states of memory elements within crossbar arrays includes a first crossbar array having first sets of row firms and column lines, with memory elements disposed at the intersections between the row lines and the column lines, a second crossbar array having second sets of row lines and column lines, with memory elements disposed at the intersections between the row lines and the column lines, and a comparator having a first input connected to the first crossbar array and a second input connected to the second crossbar array, wherein the first input is configured to receive a sense voltage from as select column in the first crossbar array and the second input is configured to receive a reference voltage from a corresponding select column in the second crossbar array.

15 Claims, 6 Drawing Sheets

(56) References Cited

U.S. PATENT DOCUMENTS

| | | |
|---|---|---|
| 2005/0276138 A1 | 12/2005 | Inoue |
| 2006/0092689 A1* | 5/2006 | Braun .................... G11C 7/067 |
| | | 365/158 |
| 2008/0285360 A1* | 11/2008 | Sakimura ................ G11C 7/02 |
| | | 365/189.15 |
| 2009/0027952 A1* | 1/2009 | Kang .................. G11C 11/5678 |
| | | 365/163 |

OTHER PUBLICATIONS

Rapole, H. et al, Resistive Memory Sensing Using Delta-sigma Modulation, Research Paper, Department of Electrical and Computer Engineering, Boise Slate University, Feb. 26, 2009, 4 pages.

* cited by examiner

SENSING CIRCUIT FOR RESISTIVE MEMORY ARRAY

BACKGROUND

As the use of digital data increases, the demand for faster, smaller, and more efficient memory structures increases. One type of memory structure that has recently been developed is a crossbar memory structure. A crossbar memory structure includes a set of upper parallel wires that intersect a set of lower parallel wires. A programmable memory element configured to store digital data is pieced at each intersection of the wires.

One type of programmable memory element that may be used is a memristive element. A memristive dement is a device that changes the state of its resistance based on an applied programming condition. For example, a programming condition may be applied to change the memristive element from a high resistive state to a low resistive state or vice versa. A high resistive state may represent a digital "1" and a low resistive state may represent a digital "0".

One challenge that results from use of a crossbar memory structure is the process of reading the state of a target memory element within the crossbar array. The state of a memory element may be determined by applying a sense voltage to the target memory element. Then, the electric current flowing through the target memory element will be indicative of the resistive state of the target memory element. However, when applying a sense voltage to a target memory element, the electric current flowing from the target memory element will be adversely affected by the half-selected memory elements within the crossbar array. It is difficult, therefore, to isolate the electric current flowing through the target memory element that is resulting from only the applied sense voltage across the target memory element.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Figure 1:
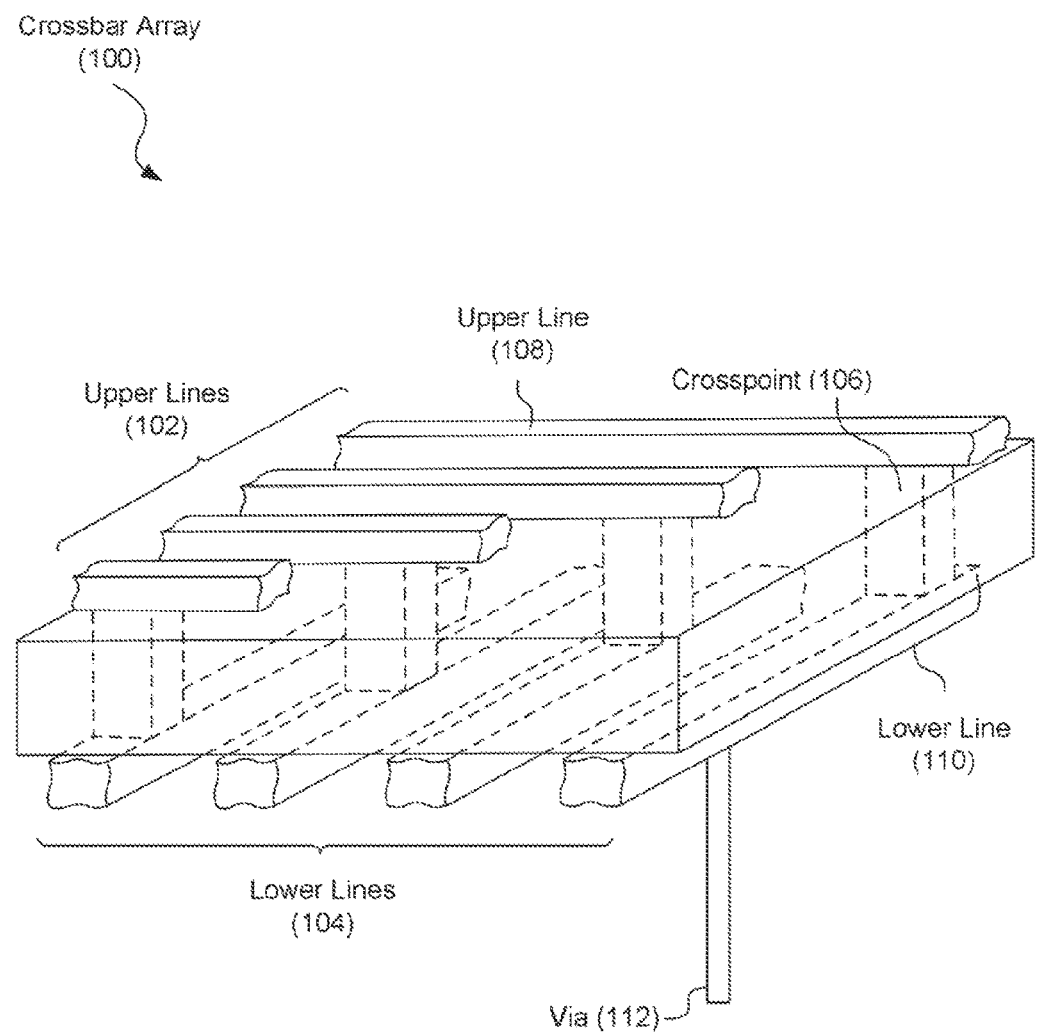
FIG. 1 is a diagram showing an illustrative crossbar array according to one example of the principles described herein.

As mentioned above, one challenge that results from use of a crossbar memory structure is the process of reading the state of a target memory element. The state of a target memory element may be determined by applying a sense voltage to the element. The electric current flowing through the target memory element will then be indicative of the resistive state of the element. However, when applying a sense voltage to a target memory element, the electric current flowing from the target memory element will be adversely affected by the half-selected memory elements within the crossbar array. Thus, it is difficult to isolate the electric current flowing through the target memory element that is resulting from only the applied sense voltage across the target memory element, in light of these and other issues, the present specification discloses a system and method for accurately sensing the state of a selected target memory element within a crossbar array memory structure.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Further, as used in the present specification and in the appended claims, the term "a number of" or similar language is meant to be understood broadly as any positive number comprising 1 to infinity; zero not being a number, but the absence of a number. As used herein, the singular forms "a," "an" and "the" are intended to include the plural forms as well, unless the context clearly indicated otherwise.

Throughout this specification and in the appended claims, the term "memory structure" is to be broadly interpreted as the physical structure of an electronic circuit designed to store digital data. A memory structure may include a number of programmable devices configured to be set to a number of different states.

Throughout this specification and in the appended claims, the term "crossbar array" is to be broadly interpreted as a number of lower wire lines intersecting a number of upper wire lines. A programmable logic device is disposed at each crosspoint between an upper wire segment and a lower wire segment.

Throughout this specification and in the appended claims, the term "memory element" is to be broadly interpreted as a component configured to be programmed with a value or state and maintain that value or state to be read at a later time.

Throughout this specification and in the appended claims, the terms "row lines" and "column lines" are used to differentiate between a first set of parallel lines intersecting a second set of parallel lines. Either the row or column lines may be the upper set of lines in any particular application.

Referring now to the figures, FIG. 1 is a diagram showing an illustrative crossbar memory structure (100). According to certain illustrative examples, the crossbar memory structure (100) may include an upper set of lines (102), which may generally be in parallel. Additionally, a lower set of lines (104) is generally perpendicular to, and intersects, the upper lines (102). Programmable crosspoint or memory elements (106) are formed at the intersections between en upper line (108) and a lower line (110).

According to certain illustrative examples, the programmable crosspoint memory elements (106) may be memristive elements or devices. Memristive devices exhibit a "memory" of past electrical conditions. For example, a memristive device may include a matrix material that contains mobile dopants. The dopants can be moved within a matrix to dynamically alter the electrical operation of an electrical device. The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar structure (100) may be used to form a non-volatile memory array. Non-volatile memory has the characteristic of not losing its contents when no power is being supplied. Each of the programmable crosspoint memory elements (106) is used to represent one or more bits of data Although individual crossbar lines (108, 110) in FIG. 1 are shown with rectangular cross sections, crossbars may also have square, circular, elliptical, or more complex cross sections. The lines may also have many different widths, diameters, aspect ratios and/or eccentricities. The crossbars may be nanowires, sub microscale wires, microscale wires, or wires with larger dimensions.

According to certain illustrative examples, the crossbar memory structure (100) may be integrated into a Complimentary Metal-Oxide-Semiconductor (CMOS) circuit or other conventional computer circuitry. Each individual wire segment may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

In one example of the principles disclosed in this specification, a crossbar array includes a first plurality of upper (or column) lines or wires and a second plurality of lower (or row) lines or wires. At the intersections of each of the upper and lower lines or wires is positioned a resistive memory element, each of which comprises a resistance switch (e.g., memristor) and a selector. Each memory element has associated with it an "ON" or "OFF" state, depending on the instant value of resistance in the resistive switch. The disclosure herein provides a system and method for determining the state of the memory element. The disclosure provides first and second crossbar arrays, which can be selected from a memory structure having a plurality of crossbar arrays. Select voltages are applied to the rows and columns of the arrays to select a memory element for reading its resistive state. Following application of the select voltages, sense voltages or currents are measured and compared using a comparator. The output of the comparator signals whether the resistance of the selected memory element is in a low (or "ON") state or a high (or "OFF") state. In another examples, the output of the comparator signals whether the resistance of the selected memory element is in a low (or "OFF") state or a high (or "ON") state.

Figure 2A:
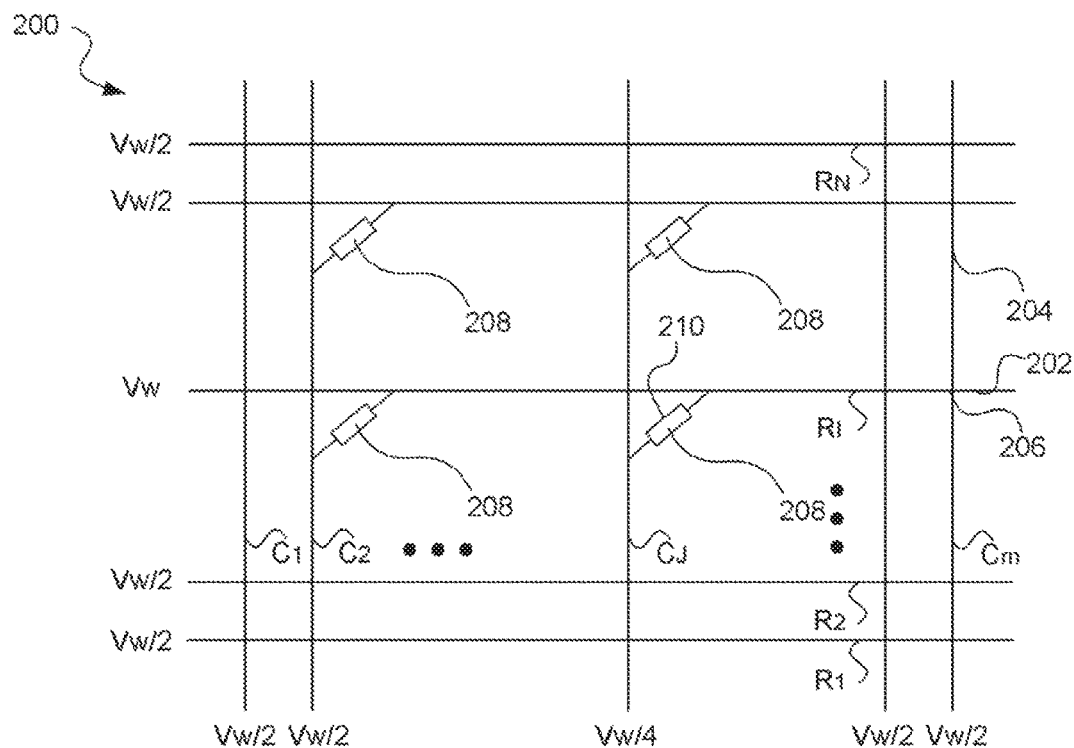
FIGS. 2A and 2B illustrate first and second crossbar arrays and a selected target memory element according to an example of the principles described herein.
Figure 2B:
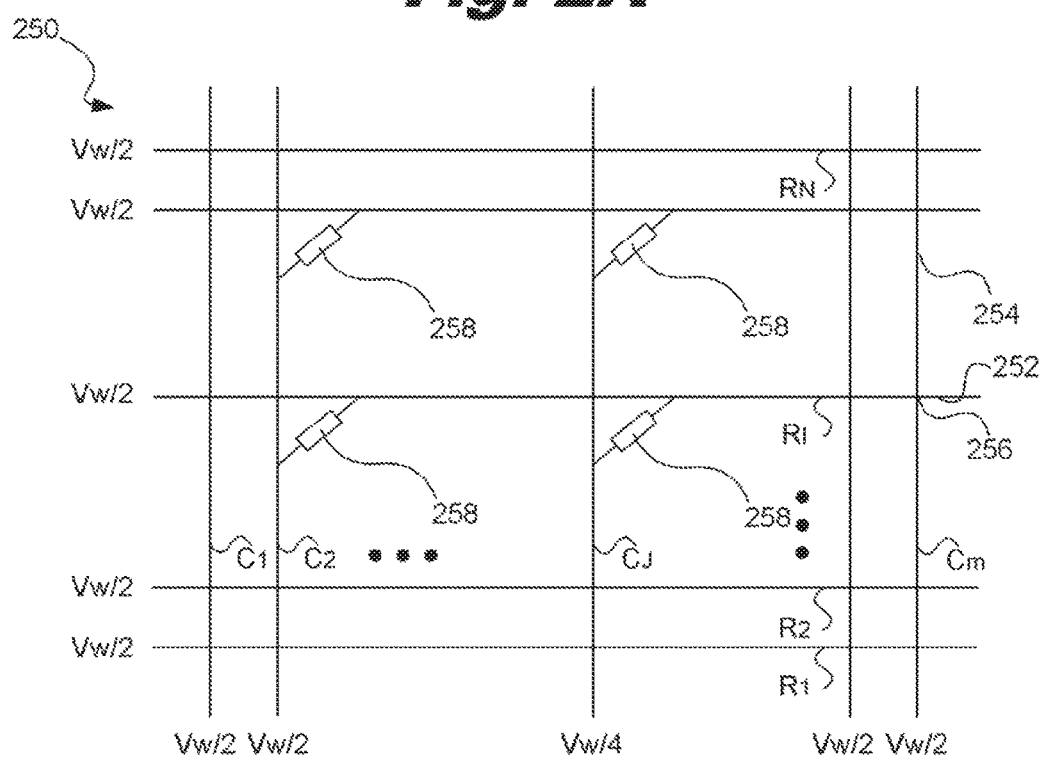

In one example, referring to FIGS. 2A and 2B, a first crossbar array (200) includes N rows (202) and M columns (204) intersecting at M*N cross points (206). Each cross point includes a memory element (208) connecting the intersecting row and column. A second crossbar array (250) also includes N rows (252) and M columns (254) intersecting at M*N dross points (256), with each cross point also including a memory element (258) connecting the intersecting row and column. The first crossbar array (200) includes a target memory element (210) located at the intersection of the $I^{th}$ row ($R_I$) and $J^{th}$ column ($C_J$). The target memory element is the memory element selected for determination of its resistive (or "ON" or "OFF") state.

To determine (or read) the state of the target memory element (210) in the first crossbar array (200), a select voltage ($V_W$) is applied to row $R_I$ and a quarter-select voltage ($V_W/4$) is applied to column $C_J$ of the first crossbar array (200). The remaining rows and columns in the first crossbar array (200) are biased to a half select voltage ($V_W/2$). The column $C_J$ in the second array (250) corresponding to the target memory element (210) in the first array (200) is biased to a quarter-select voltage ($V_W/4$), while the remaining rows and columns are each biased to a half-select voltage ($V_W/2$).

In this arrangement, the current flowing through column $C_J$ in the first crossbar array (200) is the sum of the current flowing through the target memory dement (210) plus the currents flowing through the unselected memory elements in the column. The current flowing through the target memory element (210) is $(V_W-V_W/4)/R_m$, where $R_m$ is the resistance of the target memory element (210). The current flowing through each unselected memory element is $(V_W/2-V_W/4)/R_{OFF}$, where $R_{OFF}$ is the resistance of the unselected memory elements. Thus, the total current flowing through column $C_J$ is $(V_W-V_W/4)/R_m+(N-1)(V_W/2-V_W/4)/R_{OFF}$. Similarly, the current flowing through column $C_J$ in the second crossbar array (250) is the sum of the currents flowing through each of the memory elements in the column, or $N(V_W/2-V_W/4)/R_{OFF}$. Alternatively, a reference row of cells with a known state biased to the select voltage ($V_W$) in the second crossbar array is used to provide a reference voltage that is closest to the sense voltage of one of the target states.

The foregoing currents are realized when the resistance of the selectors in the memory elements is much greater (in the low-voltage state) than the resistance of the switches in the memory elements and the threshold voltage of the selectors is set between about $V_W/4$ and about $3V_W/4$ and, in some examples, about $V_W/2$. In this realization, the current flowing through each of the unselected memory elements, in both the first array (200) and the second array (250), is nearly the same for each row in column $C_J$, regardless of the data stored in the resistance switches. Further, if the number of rows, N, is large, the total current from the unselected rows in each array is very close to one another. Thus, the main difference in the currents flowing in column $C_J$ in each array will be due to the contribution of the switch resistance in the selected target memory element (210) of the first crossbar array (200) biased by the voltage $3V_W/4$ across the target memory element (210). When the threshold voltage for the selector is set as indicated above, the added current through the target memory element (210) can become a significant portion of the total current, the value of which will depend on the resistance state of the target memory element. For example, when the resistance state of the target memory element is in the low (or "ON") state, a relatively higher current will flow through the memory element compared to the current that will flow when the resistance state of the target memory element is in the high (or "OFF") state.

Figure 3:
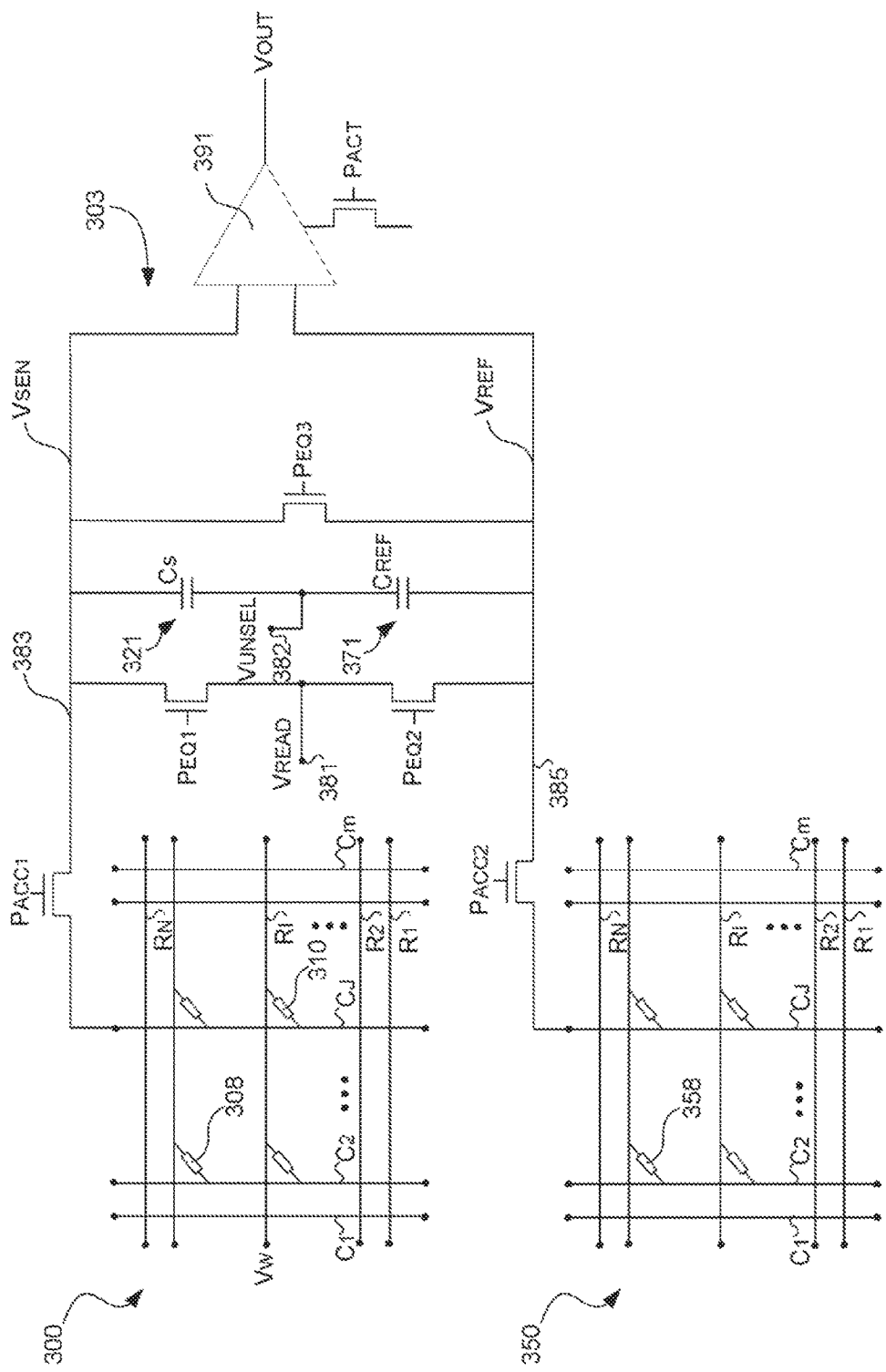
FIG. 3 provides a simplified diagram of crossbar architecture having first and second crossbar systems illustrating operation of one example of the principles described herein.

In one example according to the principles provided in this disclosure, a sensing circuit is provided that detects the resistance state of the target memory element. Referring now to FIG. 3, a sensing circuit (303) includes a sensing capacitor ($C_S$) (321) and a reference capacitor ($C_{REF}$) (371) and a read voltage ($W_{READ}$) source (381). The sensing capacitor (381) is connected between a sense voltage ($V_{SEN}$) bit line (383) and the read voltage source (381), while the reference capacitor (371) is connected between a reference voltage ($V_{REF}$) bit line (385) and the read voltage source (381). A first equalization switch ($P_{EQ1}$) connects the sense voltage bit line (383) to the read voltage source (381), a second equalization switch ($P_{EQ2}$) connects the reference voltage bit line (385) to the read voltage source (381), and a third equalization switch ($P_{EQ3}$) connects the sense voltage line (383) to the reference voltage line (385). A first array access switch ($P_{ACC1}$) connects the sense voltage bit line (383) to the column ($C_J$) having the target memory element (310) in a first crossbar array (300) and a second array access switch ($P_{ACC2}$) connects the reference voltage bit line (385) to the corresponding column in a second crossbar array (350). A differential amplifier or comparator (391) takes the sense voltage (383) and reference voltage (385) as inputs and provides an output voltage ($V_{OUT}$). An activation switch ($P_{ACT}$) switches the comparator (391) on and off. As will be explained further below, it is important to note that the sensing capacitor ($C_S$) and the reference capacitor ($C_{REF}$) need not be physical capacitors; rather, they are simply the capacitances inherent in the bit lines or the crossbar arrays.

In operation, a target memory element (310) is selected and the sense voltage (383) and reference voltage (385) are connected to the column line ($C_J$) having the target memory element (310) in the first crossbar array (300) and to the corresponding column line ($C_J$) in the second crossbar array (350). A select voltage ($V_W$) is applied to the row line ($R_I$) in which the target memory element (310) resides, Equalization switches ($P_{EQ1}$, $P_{EQ2}$, $P_{EQ3}$) connect and disconnect the sense voltage line and the reference voltage line to and from the read voltage source. All other row lines and column lines in both the first and second crossbar arrays are biased at an unselect voltage ($V_{UNSEL}$). In practice, the voltages at all row and column lines for each array may be applied using switches, which may, for example, comprise CMOS transistors. As described above, in certain examples, the unselect voltage ($V_{UNSEL}$) may be set to a half-select voltage ($V_W/2$) while the read voltage ($V_{READ}$) may be set to a quarter-select voltage ($V_W/4$). Those skilled in the art will appreciate that other voltages may be applied.

Figure 4:
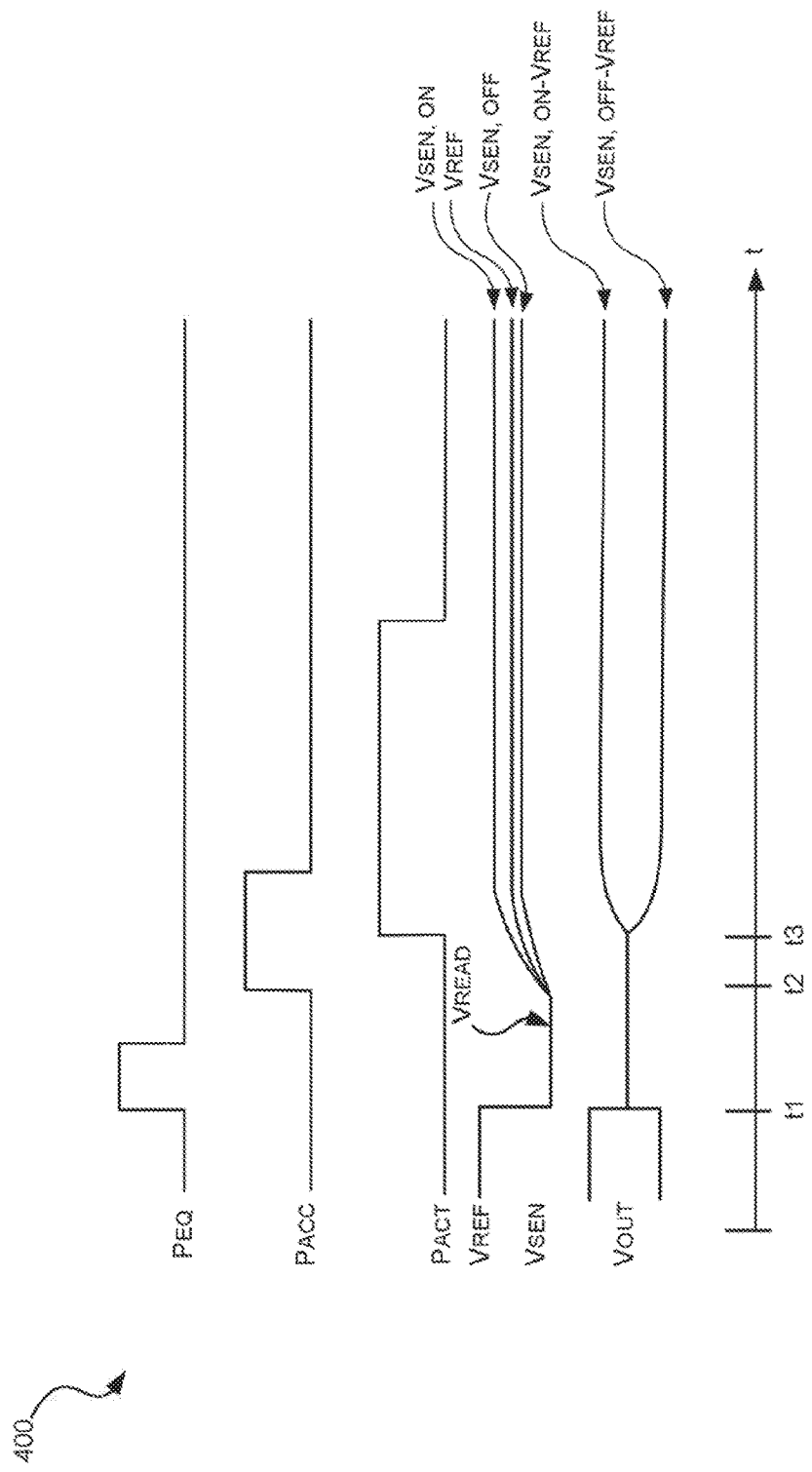
FIG. 4 is a diagram illustrating the switching sequence and voltage response during reading the resistive state of a memory element according to one example of the principles described herein.

Referring also to FIG. 4, the timing for the switching operations and resulting response voltages at $V_{SEN}$, $V_{REF}$ and $V_{OUT}$ illustrated for the example discussed with reference to FIG. 5. At $t_1$, the first, second and third equalization switches ($P_{EQ1}$, $P_{EQ2}$, $P_{EQ3}$) are closed. Closing the three equalization switches sets the voltage in the sense voltage and reference voltage bit lines (383, 385) to $V_{READ}$. The third equalization switch ($P_{EQ3}$) compensates for any differences or imperfections in the first and second equalization switches by directly coupling the two bit lines. At $t_2$, the first and second array access switches ($P_{ACC1}$, $P_{ACC2}$) are closed. The three equalization switches ($P_{EQ1}$, $P_{EQ2}$, $P_{EQ3}$) are opened at or prior to $t_2$. Closing the first and second array access switches energizes the sense voltage and reference voltage bit lines (383, 385) by the column lines ($C_J$) in the respective first and second crossbar arrays (300, 350) As indicated in FIG. 4, the values for sense voltage ($V_{SEN}$) and reference voltage ($V_{REF}$) begin to rise upon the closing of the array access switches. As will be explained in further detail below, the rise times of the two voltages reflects and depends on the capacitance values $C_S$ and $C_{REF}$. At $t_3$, the activation switch ($P_{ACT}$) is closed and the comparator (391) processes the sense and reference voltages and determines the state of the target memory element (310). Since the voltage difference between the sense voltage and the reference voltage decreases after it reaches a maximum value, the first and second array access switches ($P_{ACC1}$, $P_{ACC2}$) are opened when the difference is at its maximum.

The operation of the sensing circuit (303) is further explained by reference to FIGS. 5 and 6, which provide expanded views of the voltage response characteristics immediately following closing of the array access switches ($P_{ACC1}$, $P_{ACC2}$). As indicated above, the rise time for the sense voltage will depend on the resistance of the target memory element, which will depend on whether the target memory element is in the high resistance (or "OFF") or low resistance (or "ON") state. If the target memory element is in the low resistance (or "ON") state, then a larger current will flow through the sense voltage bit line (383), leading to a faster rise time for $V_{SEN}$ for a given capacitance $C_S$. Referring to FIGS. 3, 4, 5 and 6, $V_{SEN,ON}$ depicts the sense voltage measured at the sense voltage bit line (383) where the target memory element (310) is in the low resistance (or "ON") state. Similarly, if the target memory element is in the high resistance (or "OFF") state, then a smaller current will flow through the sense voltage bit line (383), leading to a slower rise time for $V_{SEN}$ for a given capacitance $C_S$. $V_{SEN,OFF}$ thus depicts the sense voltage measured at the sense voltage bit line (383) where the target memory element (310) is in the high resistance (or "OFF") state. For both cases, $V_{REF}$ depicts the reference voltage measured at the reference voltage bit line (385).

Figure 5:
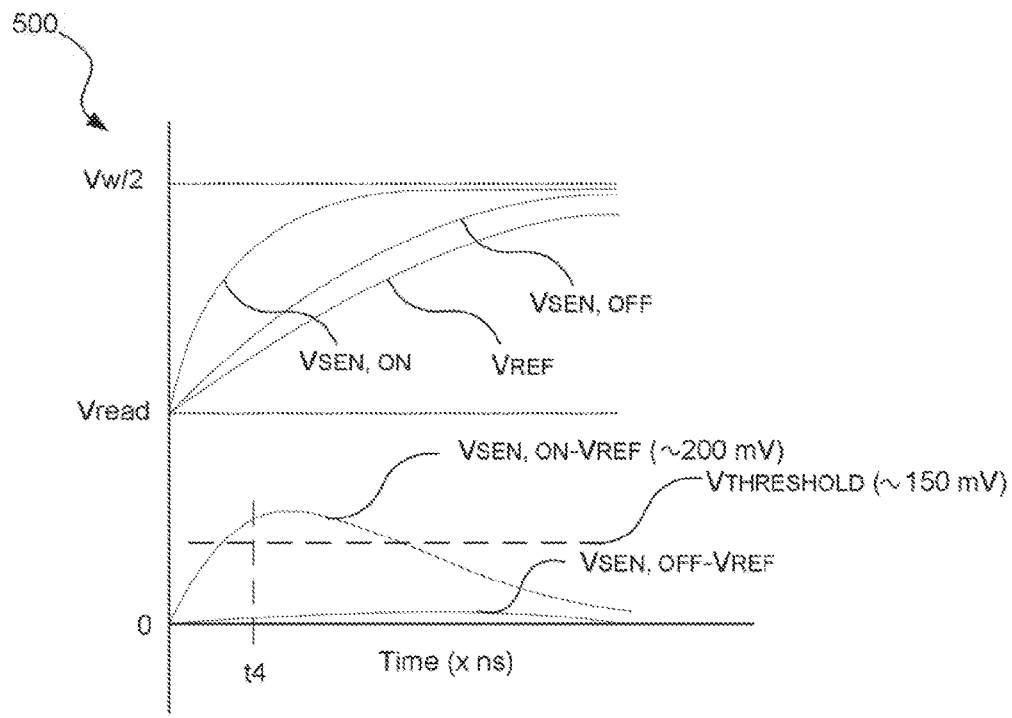
FIG. 5 provides illustrative sense voltage versus time characteristics for two resistance states of a selected target memory element of a first memory array and the corresponding reference voltage versus time characteristics for a corresponding second memory array according to an example of the principles described herein.
Figure 6:
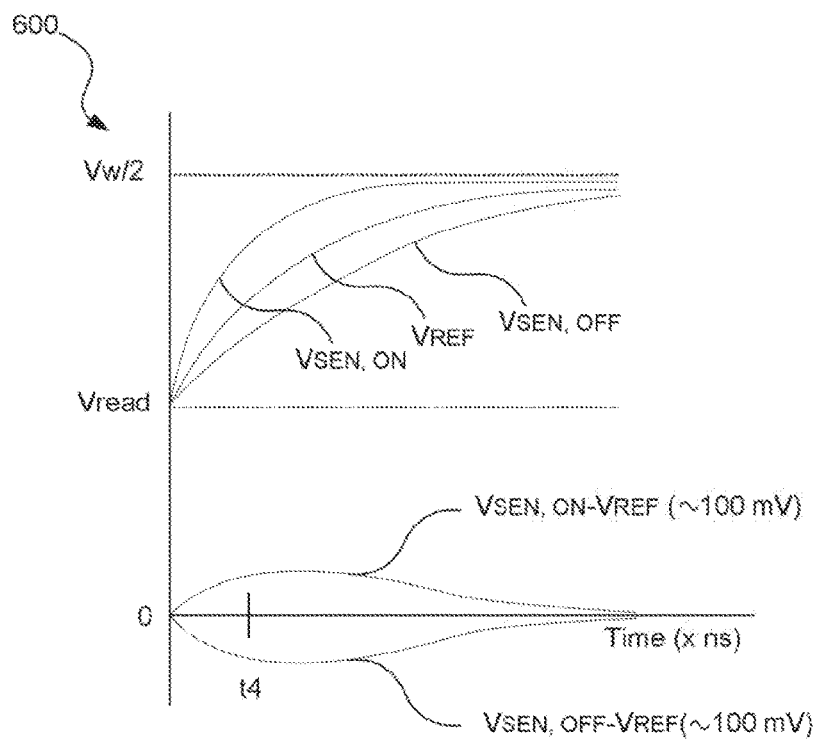
FIG. 6 provides illustrative sense voltage versus time characteristics for two resistance states of a selected target memory element of a first memory array and the corresponding reference voltage versus time characteristics for a corresponding second memory array according to an example of the principles described herein.

As illustrated in FIG. 5, the sense voltage for the target memory element (310) in the low resistance (or "ON") state, $V_{SEN,ON}$, rises faster than the sense voltage for the target memory element (310) when in the high resistance (or "OFF") state, $V_{SEN,OFF}$. If the capacitances $C_S$ and $C_{REF}$ are equal and the resistances of the selectors and resistance switches in the crossbar arrays are chosen such that $V_{SEN,OFF}$ approximately tracks $V_{REF}$ while the target memory element is in the high resistance (or "OFF") state, then the state of the target memory element can be determined by determining the voltage difference $V_{SEN}-V_{REF}$ and comparing the difference against a threshold value ($V_{THRES}$). If, for example, the maximum value of the voltage difference in the ON state is approximately 200 mV and the maximum value in the OFF state is about 10 or 20 mV, then the threshold voltage might be set at 150 mV, as indicated in FIG. 5. Thus, for example, if the voltage difference $V_{SEN}-V_{REF}$ exceeds $V_{THRES}$ at a suitable time interval following closing of the activation switch—say, for example, at time $t_4$—then the output of the comparator (391) reflects the state of the target memory element as being ON. On the other hand, if $V_{THRES}$ is not reached by time $t_4$, then the output of the comparator (391) reflects the state of the target memory element as being OFF. In another example, reference cells with a low resistance state (ON) are employed in the second array. In this case the sense voltage, when the target memory element is in the low resistance state, follows closely the reference voltage while the voltage increase is slower when it is in its high resistance state. Thus, the voltage difference $V_{SEN}-V_{REF}$ is a negative value.

A similar example response scheme is illustrated n FIG. 6. In this example, the response time for $V_{REF}$ is changed by changing the capacitance of $C_{REF}$, such that $C_{REF}$ is different from $C_S$. Such difference in the capacitances of $C_{REF}$ and $C_S$ is readily implemented by adding a separate capacitor to the existing capacitor formed by or inherent in) the wiring in the bit lines. For example, an additional capacitor can be added in parallel to the sense voltage bit line. If the increased $C_S$ capacitance is selected such that the difference $V_{SEN,ON}-V_{REF}$ is approximately equal to $V_{REF}-V_{SEN,OFF}$, then, as indicated in FIG. 6, the state of the target memory element can be obtained by determining whether $V_{SEN}-V_{REF}$ is greater or less than zero. If, for example, the maximum value of the voltage difference $V_{SEN}-V_{REF}$ in the ON state is approximately 100 mV and the maximum value in the OFF state is approximately −100 mV, then a threshold voltage might be set at 0 mV, as indicated in FIG. 6. Thus, for example, if the voltage difference $V_{SEN}-V_{REF}$ exceeds $V_{THRES}=0$ at a suitable time interval following closing of the activation switch—say, for example, at time $t_4$—then the output of the comparator (391) reflects the state of the target memory element as being ON. On the other hand, if $V_{SEN}-V_{REF}$ is less than $V_{THRES}=0$ at time $t_4$; then the output of the comparator (391) reflects the state of the target memory element as being OFF.

Figure 7:
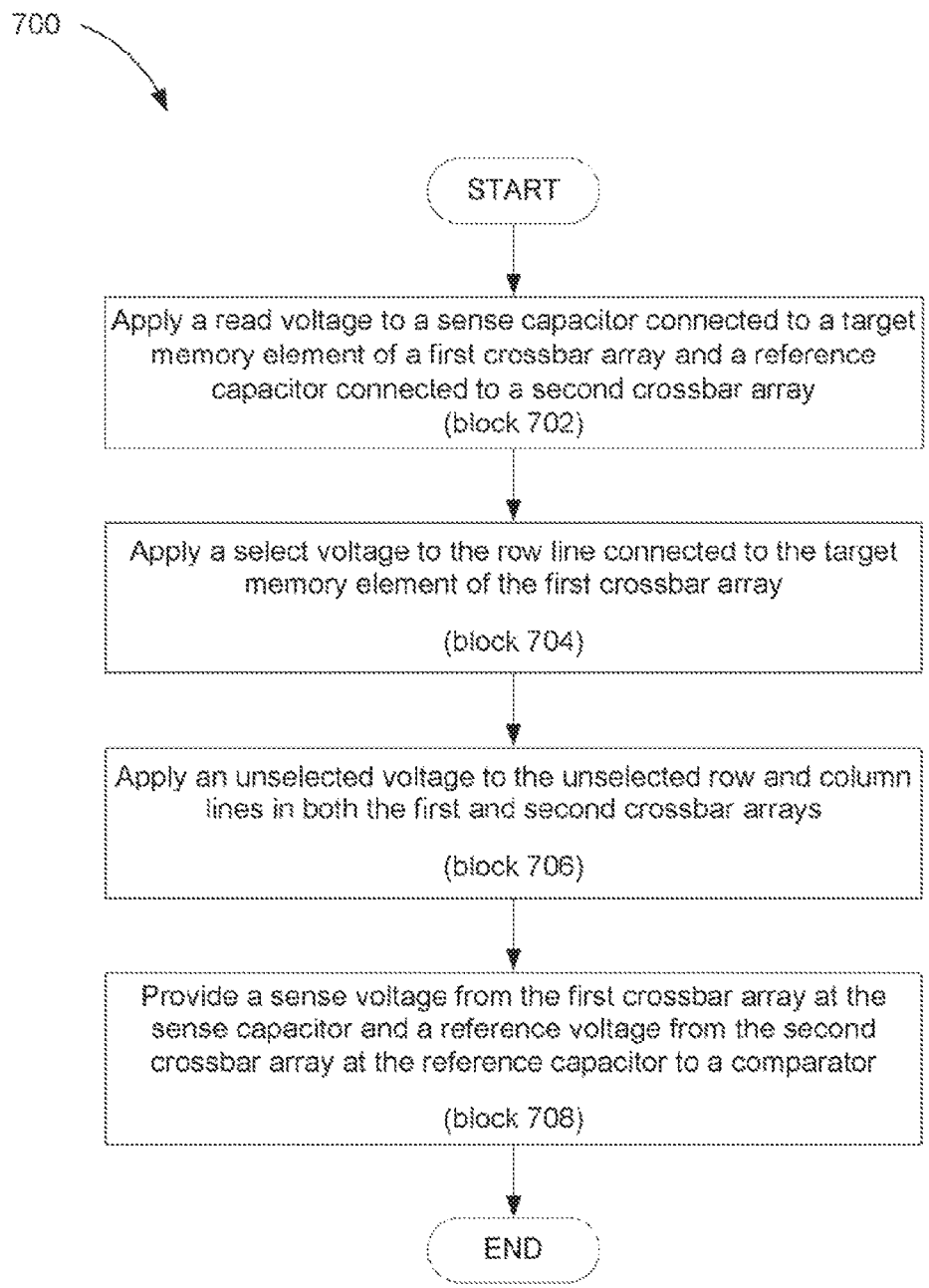
FIG. 7 is a flowchart showing an illustrative method for sensing the resistive state of a memory element within a crossbar array according to one example of the principles described herein.

FIG. 7 is a flowchart showing an illustrative method for sensing the resistive state of a memory element within a crossbar array. According to certain illustrative examples, the method may include applying a read voltage to the sense capacitor connected to a target memory element of a first crossbar array and the reference capacitor connected to a second crossbar array (block 702), applying a select voltage to the row line connected to the target memory element of the first crossbar array (block 704); applying an unselect voltage to the unselected row and column lines in both the first and second crossbar arrays (block 706); and providing a sense voltage from the first crossbar array at the sense capacitor and a reference voltage from the second crossbar array at the reference capacitor to a comparator (block 708). The method may further include determining a resistive state of the target memory element based on an output voltage of the comparator.

The forgoing described principles and examples provide a circuit and method for reading or sensing the state of a memory element in a crossbar array memory structure. The method is fast because it does not require feedback circuitry and only senses voltages. The method provides a sense signal greater than 100 mV within a few tens of nanoseconds and readily detects the signal with few components. The circuitry does not require any components other than a simple, fast comparator; all the essential components (e.g., resistance networks and current integration capacitors) are inherent in the circuitry for a resistive memory. In addition, the circuitry and method also reduced the total current through the selected columns significantly over other methods, which is helpful in reducing the operational power consumption.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A system for reading a resistive state of memory elements within a crossbar array, the system comprising:
   a first crossbar array having a first set of row lines and a first set of column lines intersecting the row lines, with memory elements being disposed at the intersections between the row lines and the column lines;
   a second crossbar array having a second set of row lines and a second set of column lines intersecting the row lines, with memory elements being disposed at the intersections between the row lines and the column lines; and
   a comparator having a first input connected to the first crossbar array and a second input connected to the second crossbar array;
   wherein the first input is configured to receive a sense voltage from a select column in the first crossbar array and the second input is configured to receive a reference voltage from a corresponding select column in the second crossbar array; and
   wherein the select column in the first crossbar array and the corresponding select column in the second crossbar array are biased to a lower voltage than remaining columns in the first crossbar array and the second crossbar array.

2. The system of claim 1, wherein a sense voltage bit line connects the select column in the first crossbar array to the first input of the comparator and a reference voltage bit line connects the corresponding select column in the second crossbar array to the second input of the comparator.

3. The system of claim 2, wherein the sense voltage bit line has a sense capacitance and the reference voltage bit line has a reference capacitance about equal in value to the sense capacitance.

4. The system of claim 2, wherein the sense voltage bit line has a sense capacitance and the reference voltage bit line has a reference capacitance lesser in value to the sense capacitance.

5. The system of claim 3, wherein the sense voltage bit line includes a first activation switch and the reference voltage bit line includes a second activation switch.

6. The system of claim 4, further including a capacitor connected in parallel with the sense voltage bit line.

7. The system of claim 1, wherein the comparator is configured to provide an output voltage corresponding to the resistive state of a target memory element in the first crossbar array.

8. A circuit for reading a resistive state of memory elements within a crossbar array, the circuit comprising:
   a sense voltage bit line having a first end and a second end;
   a reference voltage bit line having a first end and a second end;
   a comparator having a first input from the first end of the sense voltage bit line and a second input from the first end of the reference voltage bit line;

a first array access switch connected to the second end of the sense voltage bit line;

a second array access switch connected to the second end of the reference voltage bit line;

a first equalization switch connecting the sense voltage bit line to a read voltage source; and a second equalization switch connecting the reference voltage bit line to the read voltage source;

wherein a difference between the first input and the second input is biased to a larger voltage than differences between inputs corresponding to other sense voltage bit lines and reference voltage bit lines in the first array access switch and the second array access switch.

9. The circuit of claim 8, further comprising a third equalization switch connecting the sense voltage bit line and the reference voltage bit line.

10. The circuit of claim 8, wherein a capacitance of the sense voltage bit line is equal to a capacitance of the reference voltage bit line.

11. The circuit of claim 8, further comprising a capacitor connected in parallel to the sense voltage bit line.

12. A method for sensing the resistive state of a memory element in a system having a first crossbar array and a second crossbar array, comprising:

applying a read voltage to a sensing capacitor connected to a target memory element of the first crossbar array and to a reference capacitor connected to the second crossbar array;

applying a select voltage to a row line connected to the target memory element of the first crossbar array;

applying an unselect voltage to unselected row and column lines in both the first and second crossbar arrays; and providing a sense voltage from the first crossbar array at the sense capacitor and a reference voltage from the second crossbar array at the reference capacitor to a comparator.

13. The method of claim 12, further comprising determining a resistive state of the target memory element based on an output voltage of the comparator.

14. The method of claim 12, wherein the read voltage is about one-fourth the select voltage.

15. The method of claim 12, wherein the read voltage is about one-fourth the select voltage and the unselect voltage is about one-half the select voltage.

* * * * *